United States Patent [19]

Palara

[11] Patent Number: 5,525,826
[45] Date of Patent: Jun. 11, 1996

[54] INTEGRATED VERTICAL BIPOLAR AND VERTICAL MOSFET TRANSISTORS

[75] Inventor: Sergio Palara, Acitrezza, Italy

[73] Assignee: Consorzio per la Ricerca Sulla Microelettronica Nel Mezzogiorno, Catania, Italy

[21] Appl. No.: 257,779

[22] Filed: Jun. 9, 1994

[30] Foreign Application Priority Data

Jun. 10, 1993 [EP]  European Pat. Off. ............. 93830255

[51] Int. Cl.⁶ .................... H01L 29/76; H01L 27/082; H01L 29/00
[52] U.S. Cl. ................... 257/378; 257/567; 257/500
[58] Field of Search ................... 257/378, 567, 257/568, 569, 570, 689, 591, 592, 379, 380

[56] References Cited

U.S. PATENT DOCUMENTS

| | | | |
|---|---|---|---|
| 4,080,619 | 3/1978 | Suzuki | 257/591 |
| 4,402,003 | 8/1983 | Blanchard | 257/378 |
| 4,672,416 | 6/1987 | Nakazato et al. | 257/566 |
| 4,811,074 | 3/1989 | Herberg | 257/378 |

FOREIGN PATENT DOCUMENTS

| | | | |
|---|---|---|---|
| 0103934 | 3/1984 | European Pat. Off. | H01L 29/78 |
| 0176753 | 4/1986 | European Pat. Off. | H01L 27/08 |
| 0322041 | 6/1989 | European Pat. Off. | H01L 27/06 |
| WO-A-8504285 | 9/1985 | WIPO | H01L 27/02 |

Primary Examiner—Wael M. Fahmy
Attorney, Agent, or Firm—David M. Driscoll; James H. Morris

[57] ABSTRACT

An integrated structure is described, that comprises a vertical bipolar transistor and a vertical MOSFET transistor, where, in order to reduce the series resistance of the MOSFET transistor, the collector region of the bipolar transistor and the drain region of the MOSFET transistor are both parts of a common zone and are contiguous each other, so that the high charge injection in the collector region when the bipolar transistor is in conduction state, causes a simultaneous increase in the conductivity of the drain region of the MOSFET transistor.

Both transistors are formed by cells each containing an elementary bipolar transistor and an elementary MOSFET transistor.

11 Claims, 2 Drawing Sheets

INTEGRATED VERTICAL BIPOLAR AND VERTICAL MOSFET TRANSISTORS

BACKGROUND OF THE INVENTION

1. Field of the Invention

The present invention relates to integrated monolithic semiconductor structures and, more specifically, to a structure comprising a vertical bipolar transistor and a vertical MOSFET transistor.

2. Description of the Prior Art

It is well-known a structure wherein a field effect transistor is connected to a bipolar transistor To form a three-terminal device of Darlington type, that is, a device wherein the terminals, of collector and drain respectively of the two transistors are coupled into one common terminal, that constitutes one of the terminals of the device, and the source terminal of the field effect transistor is connected to the base terminal of the bipolar transistor. The other two terminals of the device consist of the gate terminal of the field effect transistor and the emitter terminal of the bipolar transistor. Such device is characterized by a high input impedance and a low driving current, by virtue of the field effect transistor acting as a driving stage, but exhibits a series resistance in conduction between the power terminals, that is the emitter and collector terminals, which is relatively high because of the series resistance (RDSon) of the field effect transistor. This is a limit in the usage of this structure for supplying power to high current loads because of the important power losses due to dissipation on the series resistance.

SUMMARY OF THE INVENTION

The main object of the present invention is to provide an integrated monolithic structure comprising a bipolar transistor and a field effect transistor having a low series resistance in conduction (RDSon).

Such object is reached according to the invention by means of a vertical bipolar transistor and a vertical MOSFET transistor, where the collector region of the first and the drain region of the latter share a common zone and are contiguous each other, so that the high charge injection in the collector region, when the bipolar transistor is in conduction, causes a simultaneous increase of conductance of the drain region of the MOSFET transistor.

In a particularly advantageous embodiment of the invention, the two transistors forming the structure are built by a plurality of substantially alike cells each comprising an elementary bipolar transistor and an elementary MOSFET transistor.

BRIEF DESCRIPTION OF THE DRAWINGS

The invention will be better understood and its advantages will result clearly by reading the following description of one examplary non-limiting embodiment thereof by reference to the attached drawings, wherein.

DETAILED DESCRIPTION OF THE PREFERRED EMBODIMENTS

Figure 1:
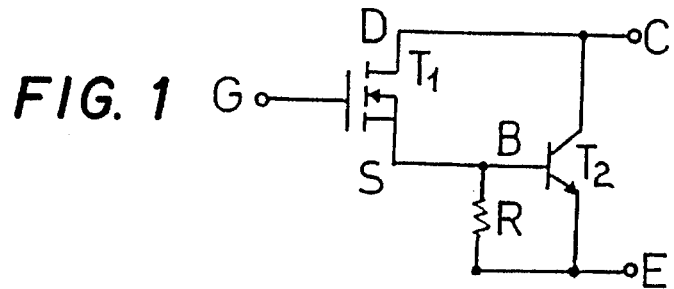
FIG. 1 shows a circuit diagram of a device that may be built with a structure integrated according to the invention.

The diagram of Figure 1 shows a device comprising a pair of transistors interconnected in a Darlington configuration. Specifically, an N channel MOSFET transistor, designated with T1, constitutes the driving stage of a power bipolar NPN transistor, designated with T2. The drain terminal D and the source terminal S of T1 are connected respectively to the collector terminal C and base terminal B of transistor T2. The gate terminal G of T1 is the driving terminal of the device and the collector terminal C and the emitter terminal E of T2 are the power terminals of the device. Between the base and the emitter of T2 a resistor R is connected to speed up the discharge of the base current of T2 in the phase of switch OFF of transistor T2.

Figure 2:
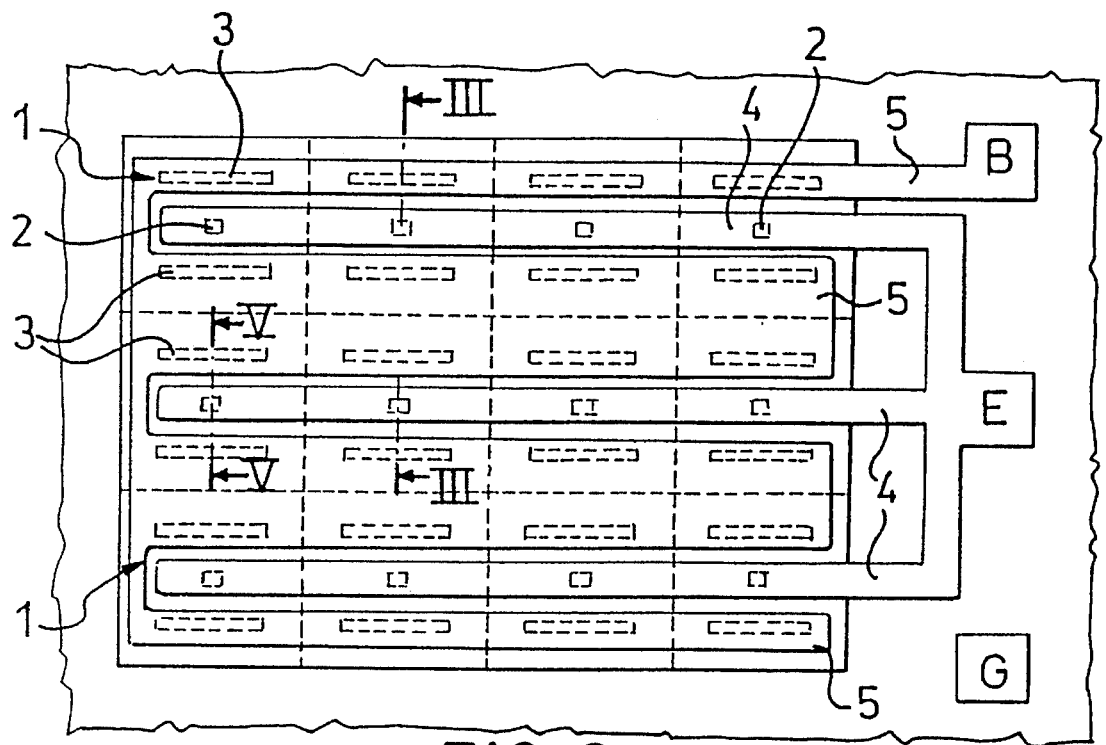
FIG. 2 is a top view of a structure integrated according to the invention.
Figure 3:
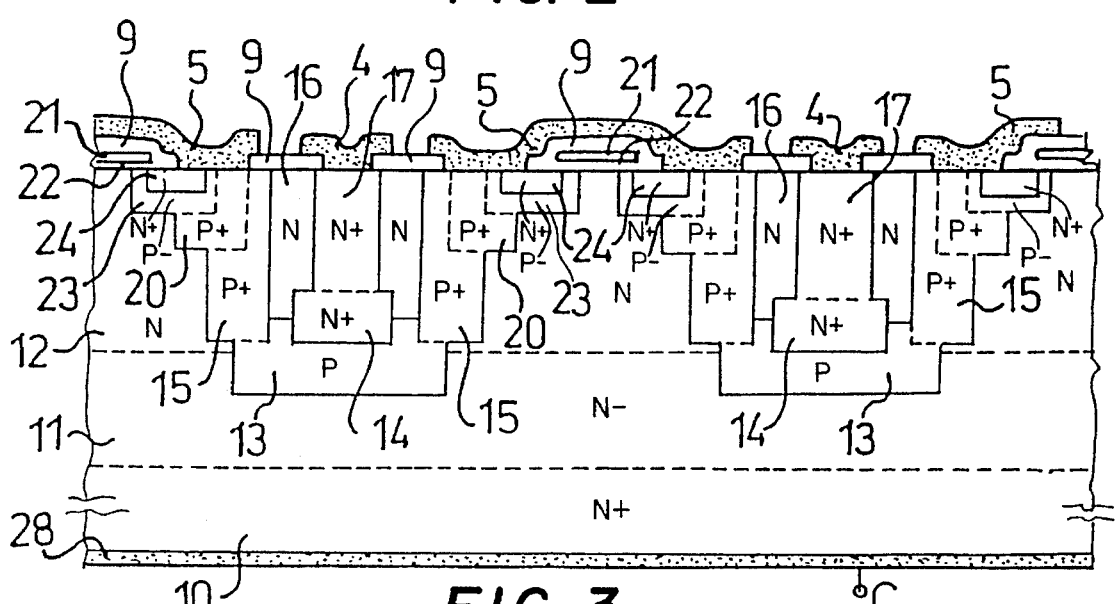
FIG. 3 is a cross sectional view, not in scale, along the line III—III, of a part of the structure in FIG. 2.

The structure shown in FIGS. 2 and 3 makes up, in an integrated form on a semiconductor chip predominantly of N type, the two transistors T1 and T2. This structure may be advantageously obtained by using standard operations of a fabrication process, described in the application for Italian Patent #6630-A/87 filed on Dec. 22, 1987 in the name of SGS-THOMSON MICROELECTRONICS s. r. l. and known as VIPower, which is a trademark of the same SGS-THOMSON. Such a process is specifically suited for building integrated structures comprising power devices and signal processing circuits for controlling the power devices.

In the preferred example the vertical bipolar transistor is of NPN type and the MOSFET transistor is of "double diffusion" (DMOS) type with N channel; they are made up with elementary transistors shaped and interconnected in a cell structure.

These cells are represented in FIG. 2 as square surfaces, designated with 1, aligned in parallel rows, each one comprising four cells. Actually, of course, the amount of cells per row as well as the amount of rows may be much higher. Each cell 1 comprises a central region 2 for the emitter contact of the relevant elementary bipolar transistor and two lateral regions 3 that constitute a base contact for the cell elementary bipolar transistor as well as a source contact for the cell elementary MOSFET transistor. The emitter contact regions 2 are electrically interconnected by metal stripes 4 ending to a common emitter terminal E and the base and source contact regions 3 are electrically interconnected by metal stripes 5 ending to a common base and source terminal designated with B. A metalized area, designated with G, is connected with an electrically conductive polycrystalline silicon layer designated with 21 in FIG. 3, that constitutes the gate electrode of the MOSFET elementary transistors, and is the control terminal of the device of FIG. 1.

The collector regions of the elementary bipolar transistors and drain regions of the elementary MOSFET transistors share a common N type zone of the chip and share a common terminal C on the back of the chip itself (FIG. 3).

Such a structure will be better understood by examining FIG. 3. As it can be seen, the structure is formed upon an N type semiconductor chip, starting from a monocrystalline silicon substrate heavily doped with N type impurities. It should be noted that in the drawings the concentrations of N type and P type impurities are designated, as usual, by adding a − or + sign to the letters N and P; letters N and P without the addition of a − or + sign indicate an intermediate concentration value. On top of the substrate 10, by epitaxial growth, a first layer 11 is formed. This layer is of the same type of conductivity, N, but with a lower concentration of impurities. On the surface of the epitaxial layer 11, P type regions are formed by implantation. These regions have a relatively lower concentration of impurities. Afterward, always by implantation, N type regions with a high concentration of impurities are formed substantially within the P type regions. A second N type layer 12 with a higher concentration of impurities than the first layer concentration is formed on the layer 11 by epitaxial growth. During this phase, occurring at high temperature, the implanted P type and N type regions propagate by diffusion into the two epitaxial layers, creating the buried regions, designated respectively, with 13 and 14 in the drawing. These regions form between each other a junction and are destined to make up the base and the emitter regions of the elementary bipolar transistor. In the second epitaxial layer P type regions are then formed with well-known masking and diffusion techniques. These P type regions having a high level of impurities, designated with 15, extend through all the second epitaxial layer 12, merge with regions 13 and constitute regions of deep base contact and insulation of the elementary bipolar transistor.

It should be noted that, in a top view, region 13 and 14 (not visible in FIG. 2) have the shape of equally centered squares and each of the regions 15 has the shape of a square frame bounding inside a portion of the second epitaxial layer 12, which is confined at the bottom by regions 13 and 14. N type wells, designated with 16, insulated from each other are thus formed.

By means of similar techniques, regions 17 are formed each one within a well 16. These regions 17 are of N type with a high concentration of impurities and extend to the respective buried regions 14, to build deep emitter contacts for each elementary bipolar transistor. P type regions are also formed, designated with 20, each one constituting the so called "deep body" of the respective elementary MOSFET transistor. These regions 20 extend along the external boundaries of the contact and insolation regions 15. Afterward, a polycrystalline silicon layer 21 is formed, that is insulated from the chip surface by a thin layer of dielectric material 22 and constitutes the gate electrode of the elementary MOSFET transistors. Then, P type regions 23 are formed, with a concentration of impurities lower than the one of the regions 20, to form the body of the elementary MOSFET transistors. These regions extend along the boundaries of deep body regions 20. Within the "body" regions 23, N type regions 24 are then formed. These regions 24 constitute the source regions of the elementary MOSFET transistors, inside the "body regions 23.

Afterward, on top of the front surface of the chip, that is covered by a layer of silicon dioxide, designated with 9, electrical interconnected patterns are formed by means of well-known deposition, masking and etching techniques. More specifically, metal stripes 4 and metal stripes 5 are formed. Metal stripes 4 connect the emitter contact zones 2 and end to the common emitter terminal E. Metal stripes 5 connect predetermined surface zones in the "deep body" 20, "body" 23 and source 24 regions. Stripes 5, besides surface interconnecting "body" and source regions, clearly constitute a contact with base regions 13 through the deep contact and insulation regions 15 and therefore they interconnect the bases of the elementary bipolar transistors. Eventually, a metal layer 28 is formed on the bottom of the substrate 10. This metal layer 28 constitutes the common collector and drain terminal C of the device.

As one can note, the collector and drain regions of the elementary bipolar and MOSFET transistors, respectively extend within the N material without intermissions. Specifically, the drain regions of the elementary MOSFET transistors in the example of FIG. 3 extend throughout the thickness of the chip and surround the "body" regions 23, as well as the "deep body" 20, contact and insolation 15 and base regions 13. The parts of these regions contributing the most to the series resistance of the MOSFET transistor T1 are the ones formed by the first epitaxial layer 11. However, these parts are very close and partly in common with the collector regions of the bipolar transistors and they experience the effect of the high charge injection in the collector region of the power transistor T2 when it is driven in strong conduction by transistor T1. In fact, it is well known that in a bipolar transistor, in conduction state, the conductivity of the collector region increases also in the parts not directly crossed by the collector current flow. Because of this effect, the resistance RDSon of the MOSFET T1 is significantly reduced. This happens more intensely, the more heavy is the conduction state of the bipolar transistor T2. In such a way, the series resistance of the device between power terminals C and E tends to decrease when the conduction increases.

Figure 4:
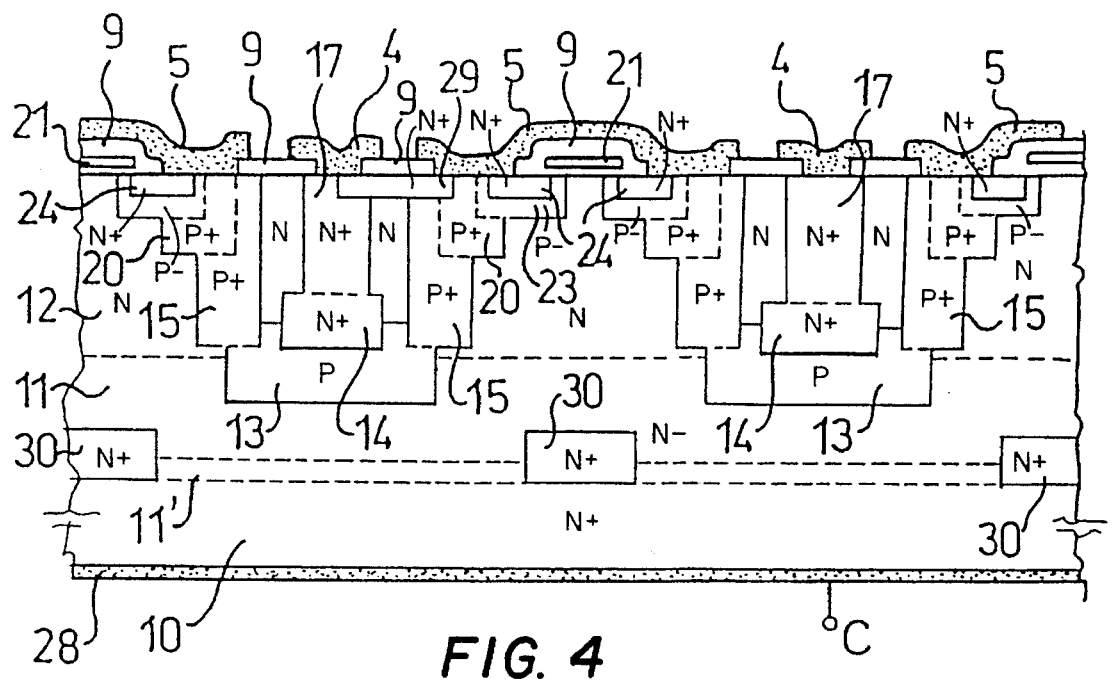
FIG. 4 is a cross sectional view similar to the one of FIG. 3 that shows a variation of the invention and FIG. 5 is a view partly cross sectional, along the line V—V of FIG. 2, and partly in a 3D sketch of a portion of the structure in FIG. 2, containing the variation of FIG. 4.
Figure 5:
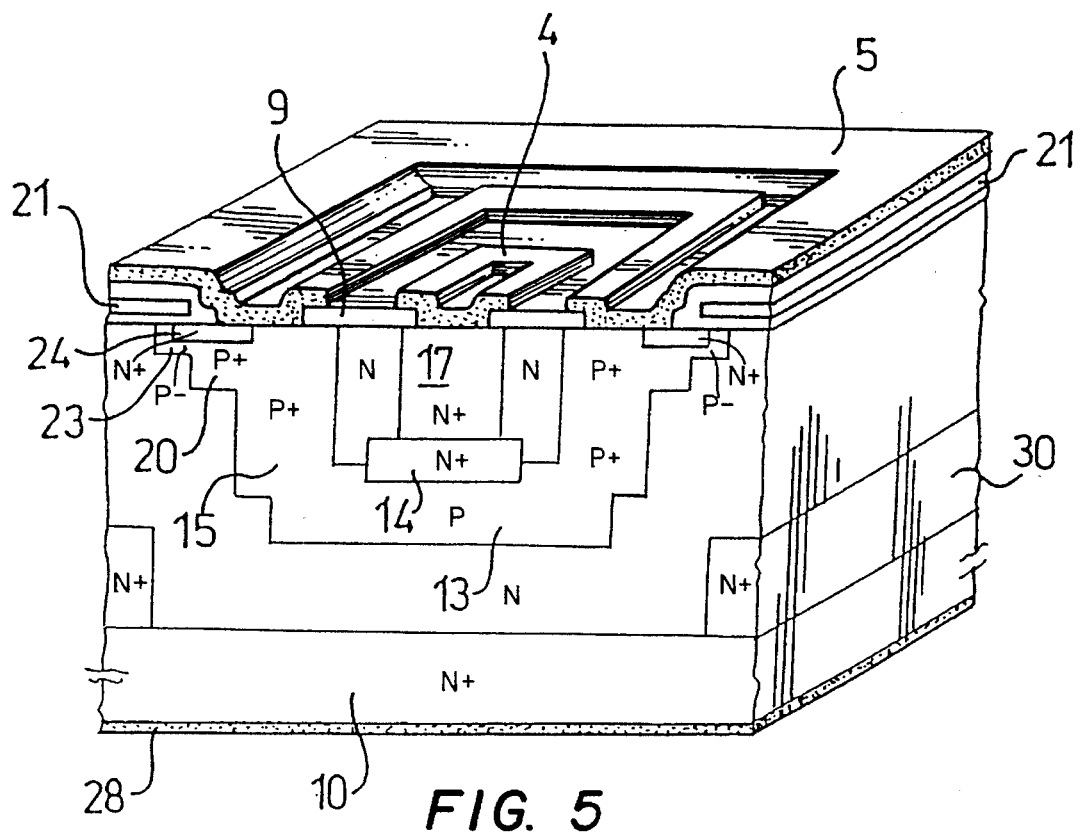

According to a variation of the invention, the integrated structure shown in FIG. 3 is modified, by forming within the drain region, where the drain current is the highest, a N type buried region with a high concentration of impurities. Such variation is shown in FIG. 4, where the same symbols and reference numerals have the same meaning as in FIG. 3. The additional buried region designated with 30, is built before the formation of the epitaxial layer 11, by forming an intermediate epitaxial layer 11' and by implanting in it N type impurities in the zones where drain regions will be formed. During the subsequent thermal processes for the formation of the epitaxial layers 11 and 12, the implanted impurities diffuse into the intermediate epitaxial layer 11' as well as into the first epitaxial layer 11, so forming the region 30. Since region 30 replaces with a highly conductive material a part of the low conductivity drain region, the resistance between drain and source of MOSFET transistor T1 decreases and so does the series resistance of the device as a whole. The resistor R shown in the circuit diagram of FIG. 1 can be built in a well-known way, by forming by diffusion an N region of appropriate dimensions and conductivity within a P region in a zone of the chip outside the cell structure shown in FIGS. 2 and 3 and connecting with dedicated metal stripes two ends of the N region to the emitter terminal E and to the base terminal B of the structure. In a convenient implementation of the structure, according to the invention, the resistor R is formed within one of the cells. Specifically, as shown in FIG. 4, the resistor R is obtained by forming an N region, designated with 29, obtained at the same time as the source regions 24 and extending between the deep emitter contact region 17 and the "deep body" region 20, connected, respectively with the metal stripe 4 of the emitter contacts and with the metal stripe 5 of the source and "body" contacts. The width of the region 29 is determined from the resistance value to be obtained. If needed, of course, a similar resistor can be obtained in several cells.

Although only one embodiment of the invention and one variation has been described, it is clear that many modifications are possible within the same invention idea. For instance, the power bipolar transistor and the MOSFET transistor could be part of a circuit configuration different from the Darlington shown in FIG. 1; that is the drain terminal may not be connected to the base terminal. Furthermore, it is clear that structures of a complementary type to the one described, can be implemented, by use of P type materials and regions in place of the N type ones and vice versa.

What I claim is:

1. A structure integrated in a chip of a semiconductor material comprising a vertical bipolar transistor and a vertical MOSFET transistor, wherein the collector region of the bipolar transistor and the drain region of the MOSFET transistor are parts of a zone of a given type of conductivity of the chip and are contiguous each other in such a way that the conductivity of the drain region is affected by the conduction state of the bipolar transistor, the structure further including a buried region, within the drain region, having a high concentration of impurities, and wherein the bipolar transistor and the MOSFET transistor form a plurality of cells, substantially like each other, each of the plurality of cells comprising an elementary bipolar transistor and an elementary MOSFET transistor, wherein the chip comprises a substrate of N type with a high concentration of impurities and a layer of N type with a low concentration of impurities formed on the substrate, the substrate and the layer comprising the zone that contains the collector and the drain regions and the buried region, the substrate including a front surface and a back surface, the substrate including on the back surface a metal layer that constitutes a common collector and drain terminal of the transistors, and wherein each cell comprises:

a P type region, buried within the N type layer with a low concentration of impurities, that constitutes the base region of the respective elementary bipolar transistor;

a P type contact and insolation region extending from the front surface of the substrate to the base region, so delimiting inside an N type region insulated from the remainder of the chip;

an N type buried region that forms a junction with the base region and constitutes the emitter region of the elementary bipolar transistor;

an N type deep emitter contact, extending from the front surface to the emitter region;

a P type region with a low concentration of impurities that extends from the front surface around the P type contact and insulation region and comprises the channel region of the elementary MOSFET transistor;

an N type region that extends from the front surface to the channel region and constitutes the source region of the elementary MOSFET transistor; and a strip of electrically conductive material laying on top of the channel region, insulated from the channel region by a layer of insulating material, that constitutes the gate electrode of the elementary MOSFET transistor;

and wherein the cells are aligned in parallel rows and are electrically interconnected, on the front surface of the chip, by a first strip of electrically conductive material, connected to the region of deep emitter contact of each cell, by a second strip of electrically conductive material, connected to the P type contact and insolation region of each cell and by a third strip of electrically conductive material connected with the source region of each cell, the first and the second strips being respectively connected to the emitter and to the base terminals of the vertical bipolar transistor, the third strip being connected to the source terminal of the vertical MOSFET transistor and the gate electrode being connected to the gate terminal of the MOSFET vertical transistor.

2. A structure according to claim 1, wherein the second and third strips are interconnected to one strip connected to a common base and source terminal.

3. A structure according to the claim 1, wherein at least one of the cells includes an N type region extending between the region of deep emitter contact and the p type contact and insolation region and being connected with the first and the second strips of electrically conductive material to form a resistor between the emitter and the base terminals of the bipolar transistor.

4. A structure according to the claim 1, wherein in place of the N type regions P type regions are provided and in place of the P type regions N type regions are provided.

5. An integrated circuit, comprising:

a vertical bipolar transistor including a base region, and emitter region, and a collector region;

a vertical field effect transistor, including a source region, a gate region, a body region that is separate from the base region of the vertical bipolar transistor and has a different impurity concentration than the base region, and a drain region, the drain region being contiguous with the collector region such that a conductivity of the drain region is increased when the collector region is conducting; and an insulation region located over the base region of the vertical bipolar transistor;

wherein the vertical field effect transistor further includes a deep body region located between the body region of the vertical field effect transistor and the insulation region.

6. The integrated circuit of claim 5, wherein the emitter region is a deep emitter region located within the integrated circuit, the integrated circuit further comprising a deep contact region that couples the emitter region to a surface of the integrated circuit.

7. The integrated circuit of claim 6, further including a low impedance region, located within the drain region, having a high concentration of impurities.

8. The integrated circuit of claim 6, further including a resistor, located between the deep contact region and the deep body region.

9. An integrated circuit, comprising:

a vertical bipolar transistor including a base region, and emitter region, and a collector region; and a vertical field effect transistor, including a source region, a gate region, a body region that is separate from the base region of the vertical bipolar transistor and has a different impurity concentration than the base region, and a drain region, the drain region being contiguous with the collector region such that a conductivity of the drain region is increased when the collector region is conducting;

wherein the vertical field effect transistor further includes a deep body region located between the body region of the vertical field effect transistor and the base region of the vertical bipolar transistor.

10. The integrated circuit of claim 9, wherein the emitter region is a deep emitter region located within the integrated circuit, the integrated circuit further comprising a deep contact region that couples the deep emitter region to a surface of the integrated circuit.

11. The integrated circuit of claim 10, further including a resistor, located between the deep contact region and the deep body region.

* * * * *